(12) United States Patent
Huh

(10) Patent No.: US 7,022,567 B2
(45) Date of Patent: Apr. 4, 2006

(54) METHOD OF FABRICATING SELF-ALIGNED CONTACT STRUCTURES

(75) Inventor: Yun Jun Huh, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 10/972,368

(22) Filed: Oct. 26, 2004

(65) Prior Publication Data

US 2005/0090086 A1   Apr. 28, 2005

(30) Foreign Application Priority Data

Oct. 27, 2003   (CN)   ...................... 200310108195 A

(51) Int. Cl.
*H01L 21/8238* (2006.01)
(52) U.S. Cl. ...................... 438/233; 438/230
(58) Field of Classification Search ................ 438/230, 438/231, 233
See application file for complete search history.

(56) References Cited

U.S. PATENT DOCUMENTS 6,281,064 B1 *   8/2001   Mandelman et al. ....... 438/233

* cited by examiner

*Primary Examiner*—Bradley K. Smith
(74) *Attorney, Agent, or Firm*—Rosenberg, Klein & Lee

(57) ABSTRACT

A method of fabricating self-aligned contact structures comprising providing a semiconductor substrate having at least two conductive structures thereon. The conductive structures are positioned beside the desired self-aligned contact structures having a plurality of masking structures thereon. Each masking structure has a top surface and a vertical surface. A dielectric layer is formed over the semiconductor substrate. A portion of the dielectric layer is removed by etching to expose the top surface and the vertical surface of each masking structure. A plurality of spacers is formed on the exposed vertical surface. While subsequently forming the self-aligned contact structures between two conductive structures, the peripheral of the nitride spacers has the low parasitic capacitance.

10 Claims, 4 Drawing Sheets

METHOD OF FABRICATING SELF-ALIGNED CONTACT STRUCTURES

BACKGROUND OF THE INVENTION

1. Field of the Invention

The present invention relates to a method of fabricating contact structures, and more particularly to a method of fabricating self-aligned contact structures in semiconductor devices.

2. Description of the Prior Art

In multilayer integrated circuit processing, a cover layer on the semiconductor substrate is usually etched by a vertical hole to form a conductive contact on the substrate. Several layers formed of different materials need to be etched. In order to ensure that the conductive contact only conducts with the semiconductor substrate, other structures, such as transistor gate structures, are isolated by an isolation sidewall and the cover layer.

However, this isolation structure is a limitation in the semiconductor device with multilayer metal interconnects during lithography processing.

As a result, the present invention provides a method of fabricating self-aligned contact structures to improve the disadvantages above.

SUMMARY OF THE INVENTION

In order to overcome these limitations, a self-aligned contact structure is provided. While forming the self-aligned contact structure, the isolation sidewall and the cover layer provide alignment or self-alignment in the etching process.

Under the condition of increasing the bit capacitor, two sidewalls of the transistor gate surround the self-aligned contact structures by using the isolation sidewalls or the cover layers. These two sidewall structures are typically composed of an oxide spacer and nitride to provide a self-aligned contact structure with low parasitic capacitance.

The present invention provides a method of fabricating self-aligned contact structures, which fabricates the self-aligned contact structure with low parasitic capacitance without forming two sidewall structures and also provides a method of forming the continuous contact plug.

The wet etching back step of the interlayer dielectric (LLD) layer on the gate stack structures and the subsequent deposition and the nitride etching steps are performed to form the nitride spacers on a portion of the gate stack structures.

To achieve the aforementioned objects, an embodiment of the present invention provides a method of fabricating self-aligned contact structures comprising a semiconductor substrate having at least two conductive structures thereon. The conductive structures are positioned on the two sides of the desired self-aligned contact structures having a plurality of masking structures thereon. Each masking structure has a top surface and a vertical surface. A dielectric layer covers the semiconductor substrate. A portion of the dielectric layer is removed by etching to expose the top surface and the vertical surface of each masking structure. A plurality of spacers is formed on the exposed vertical surface. While subsequently forming the self-aligned contact structures between two conductive structures, the peripheral of the nitride spacers has low parasitic capacitance.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1A:
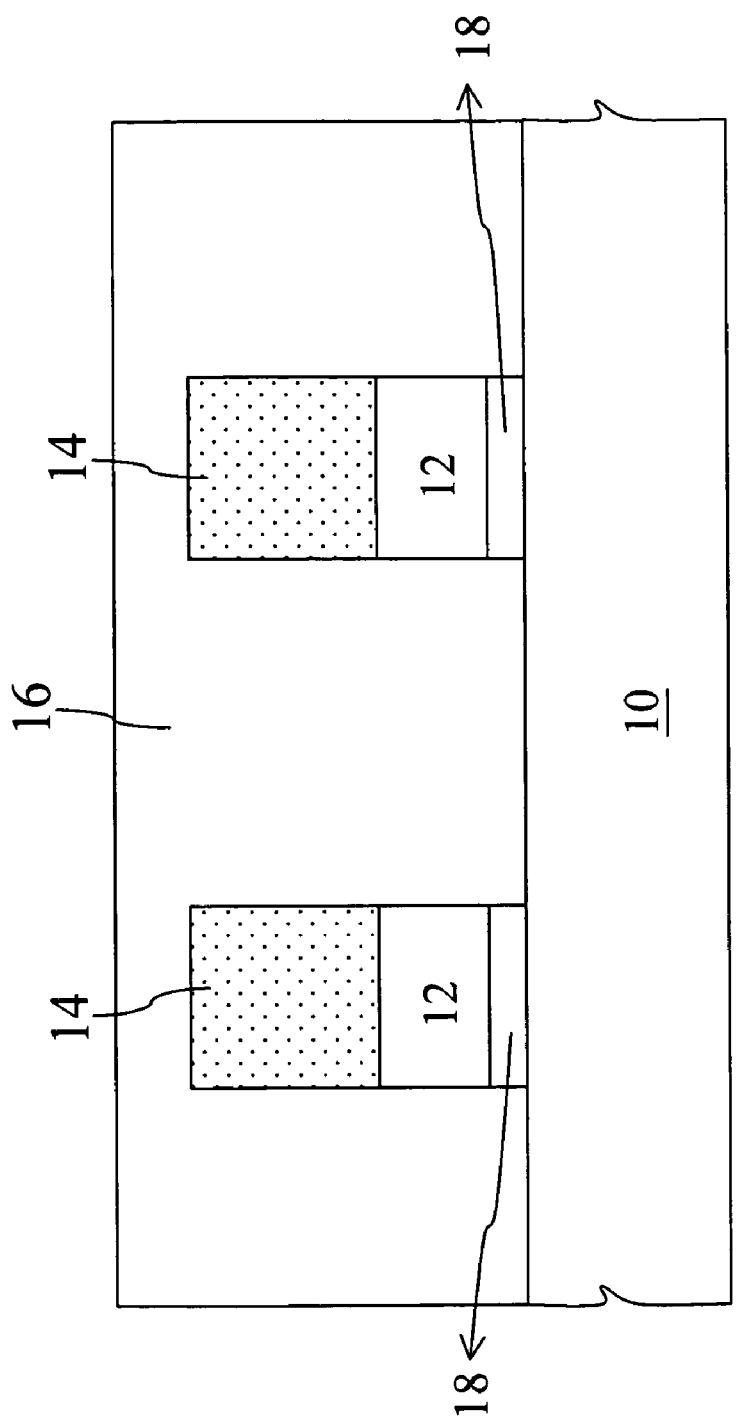
FIGS. 1A through 1D are sectional diagrams illustrating fabricating self-aligned contact structures according to a preferred embodiment of the present invention.

While the present invention may be embodied in many different forms, there is shown in the drawings and discussed herein a few specific embodiments with the understanding that the present disclosure is to be considered only as an exemplification of the principles of the invention and is not intend to limit the invention to the embodiments illustrated.

The present invention provides a new fabrication method for making self-aligned contact structures. The self-aligned contact structures are formed between a plurality of gate stack structures on a semiconductor substrate, so that the self-aligned contact structures and the gate stack structures are adjacent isolated. A semiconductor substrate is provided having the gate stack structures formed thereon. Each gate stack structure has a conductive portion on the sidewall and an isolation portion on the conductive portion. A first dielectric layer covers the gate stack structures and the semiconductor substrate. The etching back is then performed to remove a portion of the first dielectric layer to expose the isolation portion of each gate structure but not exposing the conductive portion. A nitride spacer is formed on the exposed isolation portion, and a second dielectric layer covers the gate stack structure and the semiconductor substrate. A portion of the second dielectric layer and first dielectric layer on the gate stack structure are removed for subsequently fabricating the self-aligned contact structures. The first dielectric layer and the spacer are isolated from each conductive stack structure.

As shown in FIG. 1A, a semiconductor substrate 10 is provided having a plurality of conductive structures 12 formed thereon. A dielectric layer 16 is formed on the semiconductor substrate 10 to cover the conductive structures 12 and the masking structures 14. In the present invention, the self-aligned contact structures are positioned between the conductive structures 12. In a preferred embodiment of the present invention, the conductive structures 12 are used as the conductive electrodes, and a pad oxide layer 18 is positioned between the conductive structures 12 and the semiconductor substrate 10. Each masking structure 14 has a top surface and a vertical surface used as an isolation sidewall of each masking structure 14. The pad oxide layer 18, each conductive structure 12, and the corresponding masking structure 14 are regarded as a gate stack structure. The sidewall of the conductive structure 12 is used as the conductive portion of the sidewall of each gate stack structure, and the sidewall of the masking structure 14 is used as the isolation portion of each gate stack structure. The dielectric layer 16, used as the interlayer dielectric (ILD)

layer, is formed by the conventional processing, for examples, the oxide layer can be formed by Chemical Vapor Deposition.

Figure 1B:
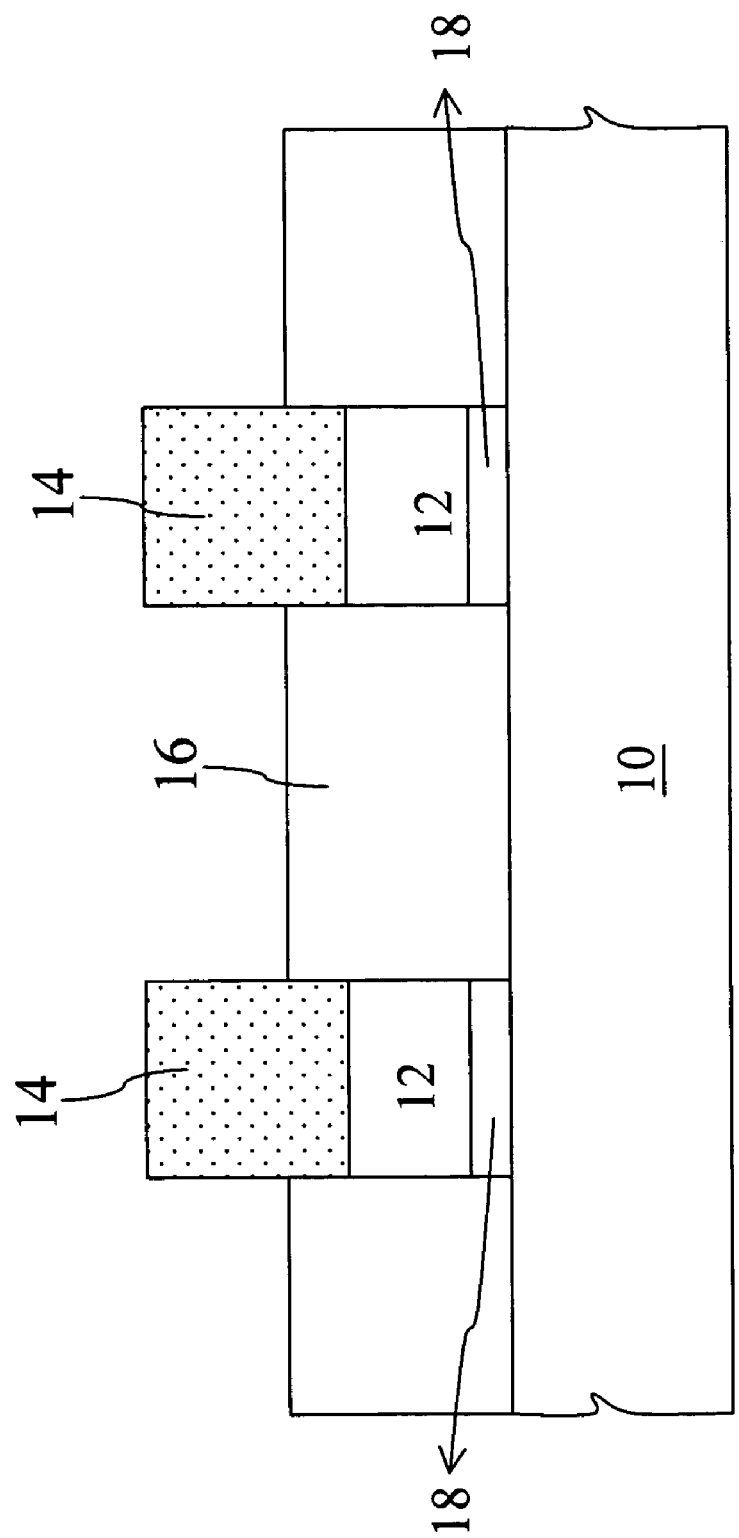

A key step, as shown in FIG. 1B, is performed to remove a portion of the dielectric layer 16 to expose the top surface and a portion of the vertical surface. In the present invention, the step of removing the portion of dielectric layer 16 is performed by, for example, wet etching back until the conductive structure 12 is exposed. This wet etching back is determined depending on the thickness of the dielectric layer 16 on the masking structure 14. In a preferred embodiment of the present invention, the dielectric layer 16 is etched from the top surface of the masking structure 14 to a depth of between 500 and 1000 angstroms in order to ensure that the conductive structure 12 has a shield layer. The conductive structure of each gate stack structure is protected from exposure. During the wet etching back, HF or BHF is preferred as an etchant.

Figure 1C:
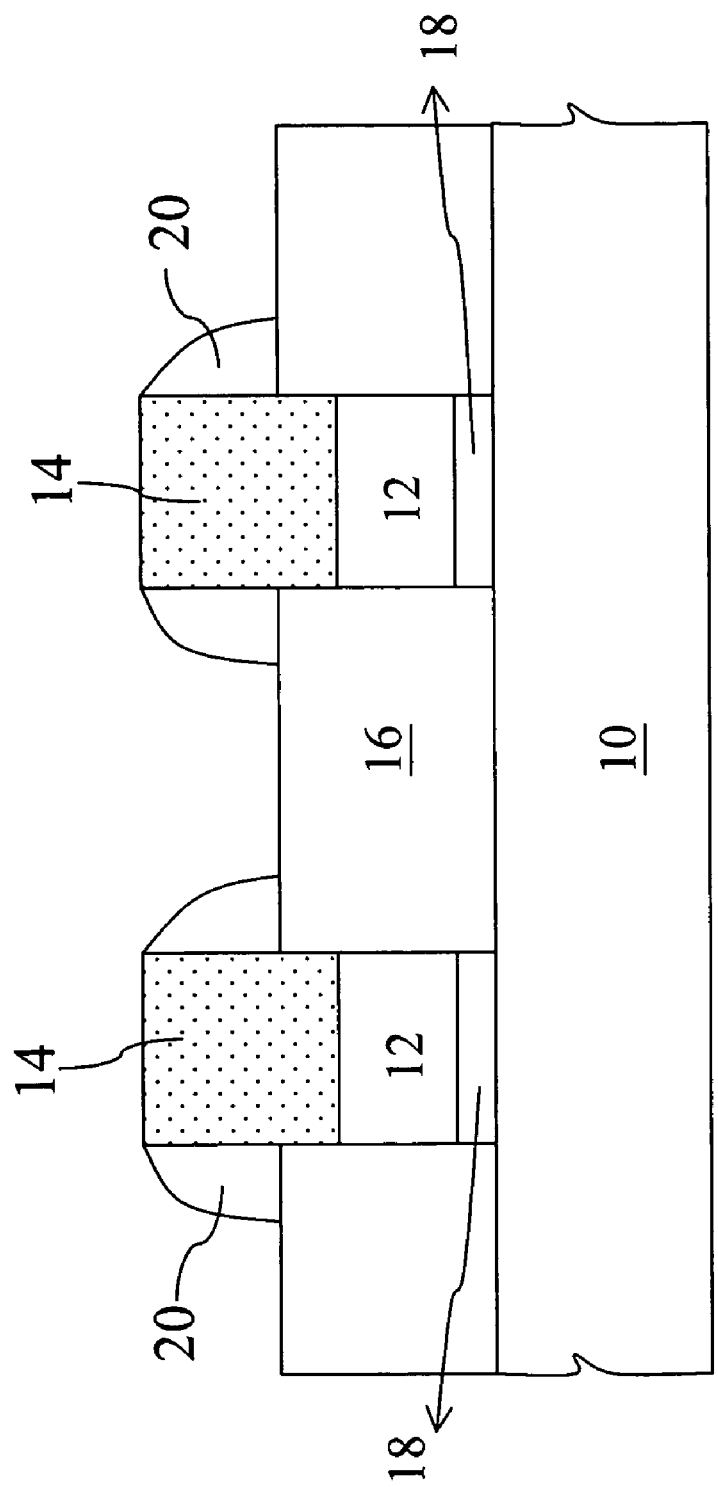
Figure 1D:
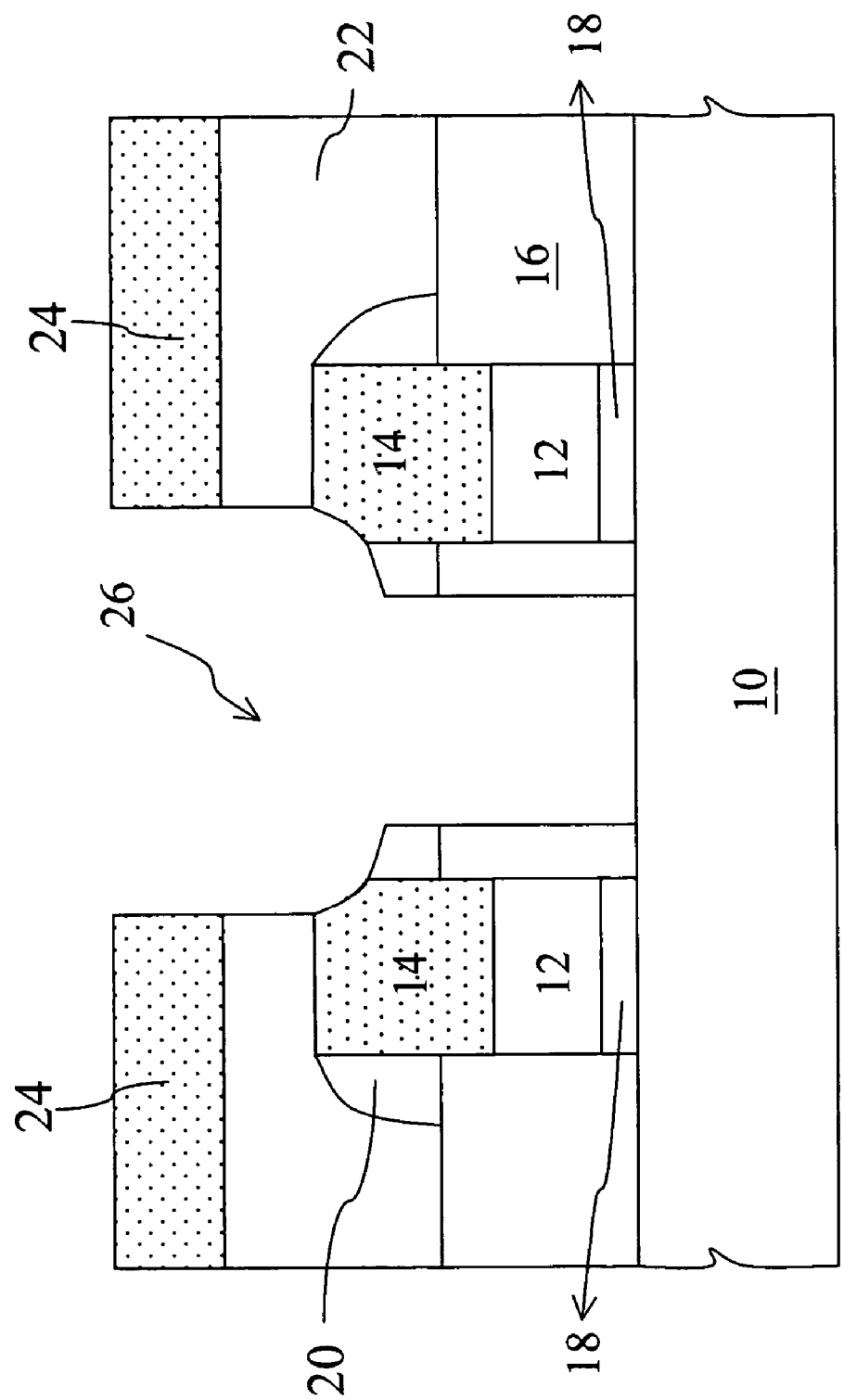

Refer to FIG. 1C, many spacers 20 are formed on the exposed vertical surface of the masking structure 14. In a preferred embodiment of the present invention, these spacer 20 are completed by nitride deposition and etching. Next, as shown in 1D, another dielectric layer 22 (for example, the interlayer dielectric layer) is covered over the dielectric layer 16, spacers 20 and the top surfaces of the masking structures 14. A mask layer 24 is then deposited on the surface of the dielectric layer 22 and patterned by lithography processing. Portions of the dielectric layer 22 and dielectric layer 16 between the conductive portions 12 are removed to form a space for a self-aligned contact structure formed therein, and a portion of the masking structures 14 and spacers 20 are also removed. In the present invention, the dielectric layer 16, spacers 20 and the dielectric layer 22 surround the peripheral of the conductive portion, so that the subsequently formed contact structures are adjacent to the conductive structure 12, thereby insulating by the dielectric layer 16 (the interlayer dielectric layer of oxide). The completed semiconductor structure provides a method of continuously forming self-aligned contact structures with low parasitic capacitance and easily forming a continuous contact plug.

The embodiment above is only intended to illustrate the present invention; it does not, however, to limit the present invention to the specific embodiment. Accordingly, various modifications and changes may be made without departing from the spirit and scope of the present invention as described in the following claims.

What is claimed is:

1. A method of fabricating self-aligned contact structures, comprising:
    providing a semiconductor substrate having at least two conductive structures formed on a surface thereof sufficiently spaced one from another for the self-aligned contact structures to be formed therebetween, a plurality of masking structures being positioned on the conductive structures, and each masking structure having a top surface and a vertical surface;
    forming a dielectric layer over the semiconductor substrate to cover the conductive structures and the masking structure;
    removing a portion of the dielectric layer by etching to expose the top surface of the masking structure and a portion of the vertical surface above a remaining portion of the dielectric layer;
    forming a plurality of spacers, each spacer being deposited on respective exposed vertical surface and contiguous the remaining portion of the dielectric layer;
    forming an interlayer dielectric layer over the remaining portion of the dielectric layer, the plurality of spacers and the top surface of the masking structures;
    forming a patterned mask over the interlayer dielectric layer; and then,
    forming an opening to expose the surface of the substrate by removing a portion of the interlayer dielectric layer, a portion of the spacers, and a portion of the remaining portion of the dielectric layer in a region between the contact structures,
wherein the contact structures are insulated by unremoved portions of the remaining portion of the dielectric layer.

2. The method of fabricating self-aligned contact structures of claim 1, wherein the etching is a wet etching back.

3. The method of fabricating self-aligned contact structures of claim 1, wherein the dielectric layer comprises an oxide layer formed by Chemical Vapor Deposition.

4. The method of fabricating self-aligned contact structures of claim 1, wherein the spacers are formed of nitride material.

5. The method of fabricating self-aligned contact structures of claim 1, further comprising an oxide layer between the semiconductor substrate and the conductive structures.

6. A method of fabricating self-aligned contact structures formed between a plurality of gate stack structures, comprising:
    providing a semiconductor substrate having the gate stack structures formed on a surface thereof, each gate stack structure having a conductive portion and an isolation portion;
    forming a first dielectric layer over the gate stack structures and the semiconductor substrate;
    removing a portion of the first dielectric layer by etching back to expose the isolation portion of each gate stack structure, a remaining portion of the first dielectric layer preventing exposure of the conductive portion;
    forming a nitride spacer on each exposed isolation portion and being contiguous with the remainig of the first dielectric layer;
    forming a second dielectric layer over the gate stack structures and the remaining portion of the dielectric layer overlaying the semiconductor substrate; and
    removing a portion of the second dielectric layer, a portion of the nitride spacers, and a portion of the remaining portion of the first dielectric layer in a region between the gate stack structures to expose the surface of the substrate thereat, wherein the gate stack structures are insulated by unremoved portions of the remaining portion of the first dielectric layer.

7. The method of fabricating self-aligned contact structures of claim 6, wherein the etching back is a wet etching back.

8. The method of fabricating self-aligned contact structures of claim 6, wherein each gate stack structure comprises an electrode structure, and the sidewalls of each gate stack structure comprise a conductive portion.

9. The method of fabricating self-aligned contact structures of claim 6, wherein each gate stack structure comprises a masking structure, and the sidewalls of each gate stack structure comprise an isolation portion.

10. The method of fabricating self-aligned contact structures of claim 6, wherein the first dielectric layer comprises an oxide layer formed by Chemical Vapor Deposition.

* * * * *